PIEZOELECTRIC CERAMICS

Filed Dec. 5, 1968

INVENTORS
NORIO TSUBOUCHI
MASAO TAKAHASHI
TOMEJI OHNO
TSUNEO AKASHI

BY Hopgood & Calimafde
ATTORNEYS

3,518,198
PIEZOELECTRIC CERAMICS

Norio Tsubouchi, Masao Takahashi, Tomeji Ohno, and Tsuneo Akashi, Tokyo, Japan, assignors to Nippon Electric Company, Limited, Tokyo, Japan Filed Dec. 5, 1968, Ser. No. 781,407
Int. Cl. C04b 35/00
U.S. Cl. 252—62.9 2 Claims

ABSTRACT OF THE DISCLOSURE

Piezoelectric ceramics are provided comprised essentially of a solid solution based on the system $$(Ag_{1/2}Bi_{1/2})TiO_3—(Ag_{1/2}Bi_{1/2})ZrO_3—PbTiO_3—PbZro_3$$

and wherein up to about 25 atom percent of lead may be replaced by at least one metal selected from the group consisting of barium, strontium and calcium.

This invention relates to piezoelectric materials and, more particularly, to piezoelectric ceramics having markedly improved properties suitable for use in particular fields.

One of the typical fields of application of piezoelectric materials is the manufacture of transducers for transmitting and receiving ultrasonic waves. In this case, the electromechanical coupling factor is very important in evaluating the properties of piezoelectric materials to be used. The electromechanical coupling factor is indicative of the efficiency of transforming electric oscillation into mechanical vibration and of conversely transforming mechanical vibration into electrical oscillation. The higher the electromechanical coupling factor, the better is the efficiency of interconversion. This is particularly desirable for piezoelectric materials for use in manufacture of transducers.

Piezoelectric materials have some other fundamental properties or factors, such as dielectric loss, dielectric constant and mechanical quality factor, which are important for evaluation purposes. With regard to piezoelectric materials used for transducers, it is desirable that the dielectric loss be small and the dielectric constant be large or small, depending on electric loads. The mechanical quality factor, on the other hand, is not too important in this instance.

The foregoing is described in detail in, for example, an article by D. Berlincourt et al., entitled "Transducer Properties of Lead Titanate Zirconate Ceramics," IRE Transactions on Ultrasonic Engineering, February 1960, pp. 1–6 and in an article by R. C. V. Macario entitled "Design Data for Band-Pass Ladder Flters Employing Ceramic Resonators," Electronic Engineering, vol. 33, No. 3 (1961), pp. 171–171.

It is generally known that conventional piezoelectric ceramics, for example, barium titanate ($BaTiO_3$) and lead titanate-zirconate [$Pb(Ti\cdot Zr)O_3$] exhibit a small electromechanical coupling factor and are not suitable for the practical use. Improvement of this factor has been made only by incorporating various additional constituents into the ceramics.

The object of this invention is, therefore, to provide novel piezoelectric ceramics having a markedly improved electromechanical coupling factor.

Another object of this invention is to provide novel piezoelectric ceramics suited for use in particular fields such as the manufacture of transducers for transmitting and receiving ultrasonic waves.

These and other objects will more clearly appear from the following description and the accompanying drawings, wherein.

Figure 1:
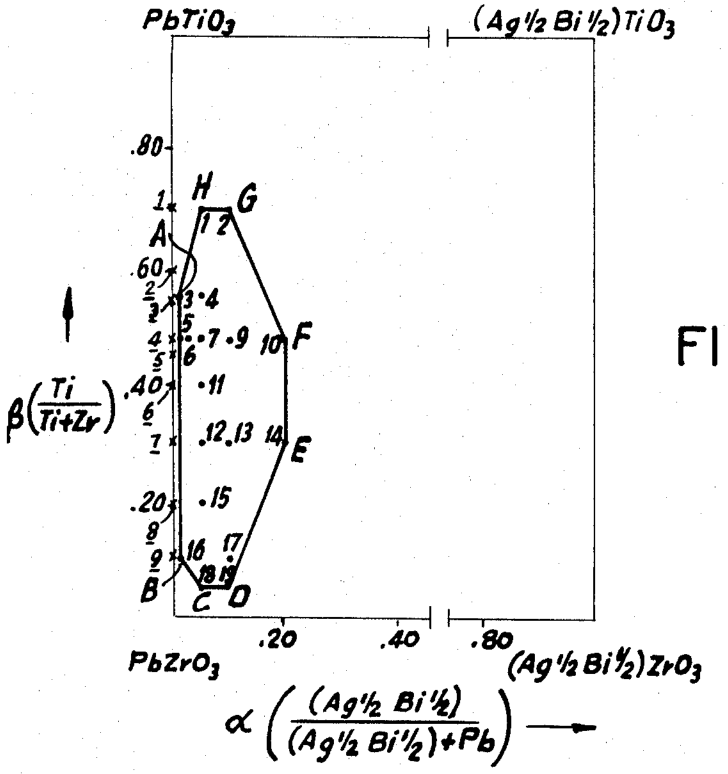
FIG. 1 is a composition diagram depicting both the effective range of the compositions of this invention and the specific compositions as exemplified in the examples.

The piezoelectric ceramics of this invention are featured by compositions consisting essentially of a solid solution based on the quaternary system $$(Ag_{1/2}Bi_{1/2})TiO_3—(Ag_{1/2}Bi_{1/2})ZrO_3—PbTiO_3—PbZrO_3$$

which contains lead (Pb) as a divalent metallic element, titanium (Ti) and zirconium (Zr) at tetravalent metallic elements, and also silver (Ag) and bismuth (Bi) in such a proportion that they may be, as a whole, considered substantially equivalent to a divalent metallic element. In the above compositions, at least one metal from the group consisting of barium, strontium, and calcium may be substituted for up to 25 atom percent of lead contained in the original compositions.

Where the ceramic compositions of the quaternary system $$(Ag_{1/2}Bi_{1/2})TiO_3—(Ag_{1/2}Bi_{1/2})ZrO_3—PbTiO_3—PbZrO_3$$

are represented by the compositional formula $$[(Ag_{1/2}Bi_{1/2})TiO_3]t[(Ag_{1/2}Bi_{1/2})ZrO_3]u[PbTiO_3]v[PbZrO_3]w$$

wherein $t$, $u$, $v$ and $w$ denote a set of molecular ratios such that $$t+u+v+w=1.00$$

and where $\alpha$ and $\beta$ are respectively defined by $$\alpha=t/(t+v)=u/(u+w)$$

and $$\beta=t/(t+u)=v/(v+w)$$

it has been found that the particularly desirable piezoelectric activity is possessed by compositions lying within the range defined by the following combinations of $\alpha$ and $\beta$:

| $\alpha$ | $\beta$ |
|---|---|
| 0.01 | 0.55 |
| 0.01 | 0.10 |
| 0.05 | 0.05 |
| 0.10 | 0.05 |
| 0.20 | 0.30 |
| 0.20 | 0.48 |
| 0.10 | 0.70 |
| 0.05 | 0.70 |

It will be seen that the above-defined $\alpha$ represents the ratio of $(Ag_{1/2}Bi_{1/2})$ to $(Ag_{1/2}Bi_{1/2})$ plus Pb, while $\beta$ represents the ratio of Ti to Ti plus Zr.

As illustrative of the excellent piezoelectric properties obtained with the ceramic compositions of this invention, the following examples are given:

EXAMPLES

Powdered materials of silver oxide ($Ag_2O$), bismuth sesquioxide ($Bi_2O_3$), lead monoxide (PbO), titanium dioxide ($TiO_2$) and zirconium dioxide ($ZrO_2$) were used as starting materials to obtain the ceramics of this invention, unless otherwise stated. The powdered materials were proportioned to provide the final specimens shown in Table 1. The conventional lead titanate ceramics were produced from lead monoxide, titanium dioxide and zirconium dioxide which were proportioned to produce the compositions shown in Table 2.

The respective powder charges were mixed in a ball mill with distilled water. The resulting mixture was subjected to filtration and then dried, crushed and pre-sintered for one hour at 900° C., and again crushed. Thereafter, the mixtures, with a small amount of distilled water added thereto were press-molded into discs of 20 mm. diameter at a pressure of 700 kg./cm.$^2$ and sintered in an atmosphere of lead oxide (PbO) for one hour at a temperature of about 1250° C. to 1300° C.

The resulting ceramic discs were polished on both surfaces to the thickness of one millimeter, provided with silver electrodes on both surfaces, and thereafter piezoelectrically activated by a polarization treatment for one hour at 100° C. or at room temperature under an applied D.C. electric field of 40 to 30 kv./cm.

After the ceramic discs had been allowed to stand for 24 hours, the electromechanical coupling factor for the radial mode vibration ($k_r$) and the mechanical quality factor ($Q_m$) were measured to evaluate the piezoelectric activities. The measurement of these piezoelectric properties was made according to the IRE standard circuit. The value of $k_r$ was calculated by the resonant to antiresonant frequency method. The dielectric constant ($\epsilon$) and the dielectric loss (tan $\delta$) were also measured at a frequency of 1 khz.

Tables 1 and 2 show typical results obtained. In the tables, specimens are arranged according to the value of $\beta$ and there are also listed several values of Curie temperature which were determined through measurement of temperature variation in the dielectric constant ($\epsilon$). The novel compositions of the specimens of Table 1 are shown with black dots in FIG. 1, while the conventional compositions of the specimens of Table 2 are indicated by crosses in the same figure.

Comparison of the results for the specimens Nos. 5 and 6 of Table 1 with those for the specimen No. 4 of Table 2 will reveal that the $k_r$ values of the novel ceramics of this invention are markedly improved over the maximum $k_r$ value of the conventional lead titanate-zirconate ceramics which, prior to the invention, were known to the best electric ceramic material. Moreover, comparison of the results for the specimens of Table 1 with those for the specimens of Table 2, particularly between the novel and conventional ceramics where the $\beta$ values are same or similar to each other, will also clarify that the ceramics of this invention have a remarkably improved $k_r$ value. This latter fact will be more clearly understood from FIG. 2, wherein curve X represents the $k_r$ values of the novel ceramics of the invention with the $\alpha$ value being fixed at 0.05 and the $\beta$ value being varied, while curve Y shows the $k_r$ values of conventional lead titanate-zirconate ceramics with the $\beta$ value similarly varied.

As is seen from the above, this invention provides the excellent, useful piezoelectric ceramics having markedly improved piezoelectric activity. In the novel ceramics of this invention, the improved piezoelectric activity as mentioned above are provided when the compositions lie within the area A–B–C–D–E–F–G–H of FIG. 1. The sets of the $a$ and $\beta$ values of the vertices of area A–B–C–D–E–F–G–H are as follows:

| | $\alpha$ | $\beta$ |
|---|---|---|
| A | 0.01 | 0.55 |
| B | 0.01 | 0.10 |
| C | 0.05 | 0.05 |
| D | 0.10 | 0.05 |
| E | 0.20 | 0.30 |
| F | 0.20 | 0.48 |
| G | 0.10 | 0.70 |
| H | 0.05 | 0.70 |

Where the $a$ value is less than that lying within the above-mentioned area, the piezoelectric properties of the ceramics obtained are inferior to or nearly equal to those of the conventional lead titanate zirconate ceramics. If the $a$ value is more than that falling within the above-mentioned area, it is difficult to sinter the composition and, moreover, the piezoelectric activity of the resulting product is inferior and has little practical use. Where the $\beta$ value does not fall within the area, the ceramics usually have markedly inferior piezoelectric activity.

In view of the above, it is important for commercial use that the product have the $a$ composition lying within area A–B–C–D–E–F–G–H of FIG. 1. The ceramics of these compositions show excellent piezoelectric properties and have a high Curie temperature, as shown in Table 1, so that the piezoelectric activity is not substantially lost when heated up to elevated temperature.

Figures 2, 3:
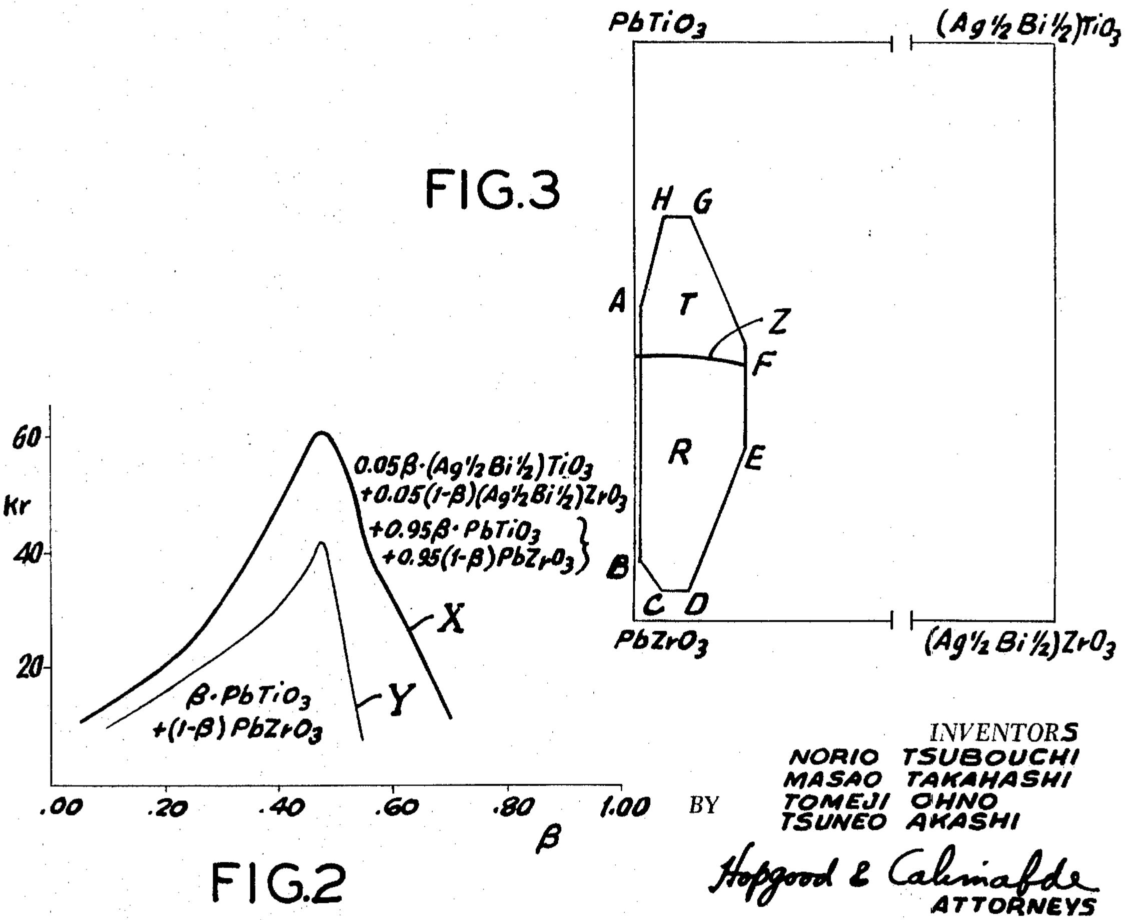
FIG. 2 is a graph showing the electromechanical coupling factors of both the conventional lead titanate-zirconate ceramics and the ceramics of this invention, as a function of the change in $\beta$ of both the ceramics.
FIG. 3 is a phase diagram illustrative of the compositions of this invention.

The quaternary system $$(Ag_{1/2}Bi_{1/2})TiO_3—(Ag_{1/2}Bi_{1/2})ZrO_3—PbTiO_3—PbZrO_3$$

of this invention exists substantially as a solid solution in most of the compositions and this solid solution has a perovskite-type crystalline structure. FIG. 3 shows the crystalline phases of the ceramic compositions lying within the area A–B–C–D–E–F–G–H of FIG. 1 as determined at room temperature by the powder method of X-ray analysis. These compositions have a perovskite-type crystalline structure and belong to either the tetragonal phase (indicated by T in the figure) or the rhombohedral phase (indicated by R). The morphotropic phase boundary Z is shown in the figure. In general, the value of $k_r$ is remarkably great in the vicinity of this phase boundary.

It will be apparent that the starting materials to be used in manufacture of the ceramics of this invention are not necessarily limited to those used in the above examples. Those oxides which may be used in place of the starting materials of the above examples include those which are easily decomposed at elevated temperature to form required compositions, such as $Pb_3O_4$ for PbO in the Example Nos. 11 and 15. Also, those salts such as oxalates or carbonates, which may be used in place of the oxides used in the examples, include those which are easily decomposed into the respective oxides at elevated temperature. Hydroxides of the same metals as above may be used instead of the oxides. However, excellent pieloelectric ceramics having similar properties to the above examples are also obtainable by preparing separately powdered material of each of the compounds $$(Ag_{1/2}Bi_{1/2})TiO_3$$

$(Ag_{1/2}Bi_{1/2})ZrO_3$, $PbTiO_3$ and $PbZrO_3$ in advance and by using them as starting materials to be mixed subsequently.

The Example No. 8 of Table 1 reveals that excellent piezoelectric activity is assured by the composition even where a part of lead is replaced by strontium. As will be appreciated, the piezoelectric activity of the compositions of the type based on lead titanate or zirconate is not lost even when up to 25 atom percent of lead contained in the composition is replaced by at least one metal of the group barium, strontium and calcium.

Generally, zirconium dioxide ($ZrO_2$) available in the market contains several percent of hafnium dioxide ($HfO_2$). Accordingly, the ceramic compositions of this invention are allowed to contain small amounts of such oxides or elements as existing in the materials available in the market. Moreover, it will be understood that small amounts of other ingredients may be present in the ceramic compositions of this invention which may further improve the piezoelectric properties, as recognized in the conventional lead titanate zirconate ceramics. Thus, it will be understood from the foregoing that the ceramic compositions of this invention may contain other appropirate additives.

Although the present invention has been described in conjunction with preferred embodiments, it is to be understood that modifications and variations may be resorted to without departing from the spirit and scope of the invention as those skilled in the art will readily understand. Such modifications and variations are considered to be within the purview and scope of the invention and the appended claims.

TABLE 1

| No. | Composition α | Composition β | $k_r$, percent | $Q_m$ | ε | Tan δ, percent | Curie temperature (° C.) |
|---|---|---|---|---|---|---|---|
| 1 | 0.05 | 0.70 | 11 | 260 | 310 | 2.1 | |
| 2 | 0.10 | 0.70 | 15 | 800 | 280 | 1.2 | |
| 3 | 0.01 | 0.55 | 21 | 90 | 420 | 2.9 | |
| 4 | 0.05 | 0.55 | 42 | 130 | 440 | 2.1 | |
| 5 | 0.01 | 0.48 | 44 | 100 | 1,110 | 2.1 | |
| 6 | 0.02 | 0.48 | 59 | 80 | 1,180 | 2.3 | 385 |
| 7 | 0.05 | 0.48 | 61 | 105 | 1,580 | 2.4 | |
| 8** | 0.05 | 0.48 | 58 | 120 | 1,600 | 2.1 | |
| 9 | 0.10 | 0.48 | 42 | 140 | 1,120 | 2.5 | |
| 10 | 0.20 | 0.48 | 14 | 170 | 620 | 2.3 | 350 |
| 11* | 0.05 | 0.40 | 47 | 120 | 410 | 2.5 | |
| 12 | 0.05 | 0.30 | 33 | 310 | 360 | 2.2 | |
| 13 | 0.10 | 0.30 | 24 | 280 | 330 | 2.1 | |
| 14 | 0.20 | 0.30 | 7 | 120 | 270 | 2.0 | |
| 15* | 0.05 | 0.20 | 21 | 37 | 290 | 2.6 | |
| 16 | 0.01 | 0.10 | 16 | 480 | 250 | 4.1 | |
| 17 | 0.10 | 0.10 | 18 | 260 | 330 | 1.8 | |
| 18 | 0.05 | 0.05 | 11 | 290 | 180 | 4.9 | |
| 19 | 0.10 | 0.05 | 8 | 190 | 160 | 2.5 | |

NOTE.—In manufacture of the specimens whose Nos. have a single asterisk (*), triplumbic tetroxide ($Pb_3O_4$) was used instead of lead monoxide (PbO) as one of the starting materials. In manufacture of the specimen with double asterisks (**), strontium carbonate ($SrCO_3$) calculated on the basis of strontium monoxide (SrO) was used to replace 5 atom % of lead (Pb) by strontium (Sr).

TABLE 2

| No. | Composition α | Composition β | $k_r$ (percent) | $Q_m$ | ε | Tan δ (percent) |
|---|---|---|---|---|---|---|
| 1 | 0.00 | 0.70 | | | 340 | 5.7 |
| 2 | 0.00 | 0.60 | | | 300 | 2.4 |
| 3 | 0.00 | 0.55 | 8 | 30 | 350 | 1.3 |
| 4 | 0.00 | 0.48 | 42 | 250 | 1,060 | 1.6 |
| 5 | 0.00 | 0.45 | 38 | 290 | 640 | 3.0 |
| 6 | 0.00 | 0.40 | 30 | 320 | 460 | 3.1 |
| 7 | 0.00 | 0.30 | 24 | 380 | 380 | 3.3 |
| 8 | 0.00 | 0.20 | 15 | 470 | 350 | 3.3 |
| 9 | 0.00 | 0.10 | 10 | 580 | 280 | 3.4 |

NOTE.—For the specimens Nos. 1 and 2, evaluation of piezoelectric activity was unattainable.

What is claimed is:

1. A piezoelectric ceramic consisting essentially of the composition represented by the formula $$[(Ag_{1/2}Bi_{1/2})TiO_3]_t[(Ag_{1/2}Bi_{1/2})ZrO_3]_u[PbTiO_3]_v[PbZrO_3]_w$$

wherein $t$, $u$, $v$ and $w$ denote a set of molecular ratios and $t+u+v+w=1.00$, and which compositions lie within the area A–B–C–D–E–F–G–H of FIG. 1 of the drawings, the vertices of said area being determined by the following combinations of α and β, where said α and β are respectively given by the formula $$\alpha=t/(t+v)=u/(u+w)$$

and $$\beta=t/(t+u)=v/(v+w)$$

as follows:

| | α | β |
|---|---|---|
| A | 0.01 | 0.55 |
| B | 0.01 | 0.10 |
| C | 0.05 | 0.05 |
| D | 0.10 | 0.05 |
| E | 0.20 | 0.30 |
| F | 0.20 | 0.48 |
| G | 0.10 | 0.70 |
| H | 0.05 | 0.70 |

2. The piezoelectric ceramic of claim 1, wherein up to 25 atom percent of lead may be replaced by at least one metal selected from the group consisting of barium, strontium and calcium.

References Cited

UNITED STATES PATENTS 3,268,783 8/1966 Saburi ............ 106—39 X

FOREIGN PATENTS 888,740 2/1962 Great Britain.

TOBIAS E. LEVOW, Primary Examiner

J. COOPER, Assistant Examiner

U.S. Cl. X.R.

106—39